United States Patent [19]

Maini

[11] Patent Number: 4,731,760
[45] Date of Patent: Mar. 15, 1988

[54] ON-CHIP TEST CIRCUITRY FOR AN ECL PROM

[75] Inventor: Rajnish Maini, Chandler, Ariz.

[73] Assignee: Motorola, Inc., Schaumburg, Ill.

[21] Appl. No.: 859,581

[22] Filed: May 5, 1986

[51] Int. Cl.[4] .............................................. G11C 7/00
[52] U.S. Cl. ..................................... 365/201; 365/104
[58] Field of Search ................... 371/21; 365/201, 96, 365/104

[56] References Cited

U.S. PATENT DOCUMENTS 4,459,694  7/1984  Ueno et al. ............................. 371/21
4,543,647  9/1985  Yoshida ................................ 365/201

Primary Examiner—Joseph A. Popek
Attorney, Agent, or Firm—William E. Koch

[57] ABSTRACT

An improved programmable read only memory having a plurality of input pins and a plurality of memory elements is provided for testing the functionality and performance of the device without programming the memory. One of a combination of input signals applied to the input pins selects one of the memory elements for providing an output representative of the state of the memory element. A test circuit is coupled between the input pins and both the memory elements and a plurality of test memory elements for deselecting the memory elements and selecting the test memory elements.

29 Claims, 4 Drawing Figures

ON-CHIP TEST CIRCUITRY FOR AN ECL PROM

FIELD OF THE INVENTION

This invention relates in general to ECL PROMs (Emitter-Coupled-Logic Programmable Read Only Memories) and, more particularly, to an ECL PROM having circuitry including test rows and columns for testing the functionality and performance of the device without programming the memory.

BACKGROUND OF THE INVENTION

PROMs conventionally comprise a plurality of lateral or vertical fuses wherein a predetermined number of fuses are located in a row coupled to a word line and another predetermined number of fuses are located in a column coupled to a bit line. In other words, each fuse is uniquely coupled in a combination of columns and rows.

When a fuse is intact (electrically closed), it represents one digital state, i.e., "1". When the fuse is programmed or "blown" (electrically open), it represents a different digital state, i.e., "0". PROMs are manufactured with the fuses in the closed state and are subsequently programmed by applying a relatively high voltage between selected word lines and bit lines to open specific fuses.

Vertical fuses typically comprise two back to back diodes having common anodes. Lateral fuses typically comprise a film of a material, i.e., nichrome, horizontally formed across a surface of the semiconductor chip. Memory circuits over time have become larger and more complex. The ability of manufacturers to fabricate these memory circuits as integrated circuits is difficult and it is not rare for errors to be made wherein the fuses and associated on chip circuitry such as input/output buffers, regulators, decoders, sense amplifiers, and multipliers will not function properly.

One previously known method of testing the functionality of the memory circuit was to manufacture test rows and test columns on the PROM, in addition to the normal rows and columns; program fuses between the test rows and test columns; and then test for fuses actually programmed. This would give some indication of the probability of the remaining fuses on the PROM of being programmed successfully and of the functionality of the associated circuitry.

However, this method did not check all functional blocks of the circuit and it required additional pins to access test bits. If additional pins were not available, the test bits could not be used in packaged form.

Another previously known method of testing the functionality of the memory circuit was to program a sample of a group of PROMs; test the programmed sample for fuses actually programmed; and predict the functionality of the remaining PROMs from the group based on statistical probabilities.

However, this method destructively consumed the number of PROMs used in the sample and the results from the testing of the sample did not always correlate with the actual functionality of the remaining group.

Thus, what is needed is an on-chip circuit that provides for the testing of the functionality of the fuses and associated circuits of a memory circuit without requiring additional input/output pins.

SUMMARY OF THE INVENTION

Accordingly, it is an object of the present invention to provide an improved PROM.

Another object of the present invention is to provide a PROM having on-chip circuitry that will provide for the testing of the functionality of the fuses and associated circuits of a memory circuit.

Still another object of the present invention is to provide a PROM having on-chip circuitry that will provide for the testing of the functionality of the fuses and associated circuits of a memory circuit without requiring additional input/output pins.

Yet another object of the present invention is to provide a PROM having on-chip circuitry that will provide for the testing of the a.c. and d.c. circuit performance without programming the memory.

In carrying out the above and other objects of the invention in one form, there is provided an improved programmable read only memory having a plurality of input pins and a plurality of memory elements, wherein one of a combination of input signals applied to the input pins selects one of the memory elements for providing an output representative of the state of the memory element. A test circuit is coupled between the input pins and both the memory elements and a plurality of test memory elements for deselecting said memory elements and selecting said test memory elements.

The above and other objects, features, and advantages of the present invention will be better understood from the following detailed description taken in conjunction with the accompanying drawings.

DETAILED DESCRIPTION OF THE INVENTION

Figure 1:
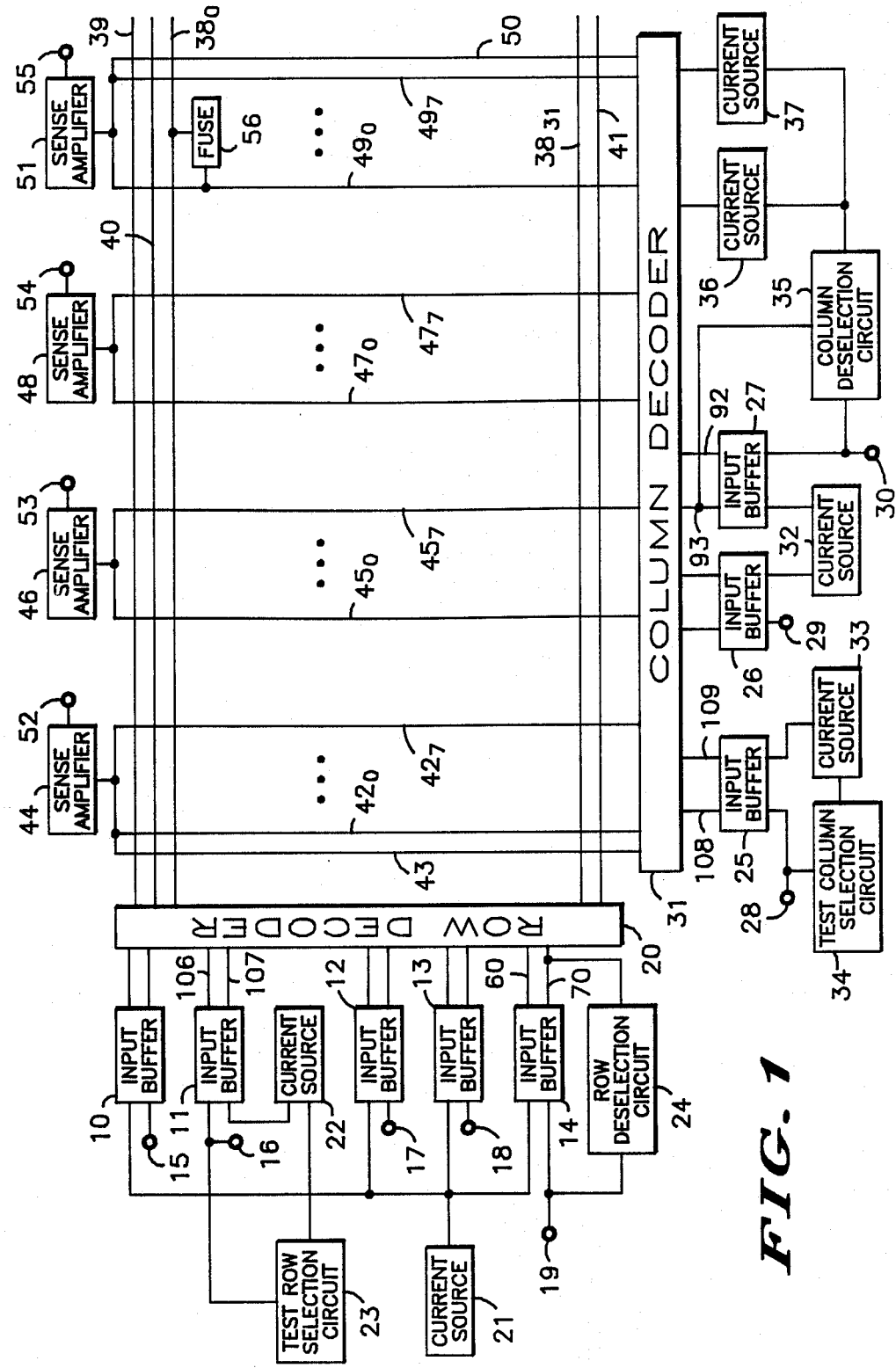
FIG. 1 is a block diagram of the present invention.

Referring to FIG. 1, a memory circuit in accordance with the present invention is shown which is suitable to be fabricated in monolithic integrated circuit form. The circuit shown is a 256×4 PROM having 1024 bits of memory. The invention described herein would apply equally well to other size memory circuits.

Input buffers 10, 11, 12, 13 and 14 each have an input coupled to input terminals 15, 16, 17, 18, and 19, respectively, for each receiving a digital input signal. Each input buffer 10, 11, 12, 13 and 14 has two outputs coupled to row decoder 20 for providing two complementary logic signals from each input buffer 10, 11, 12, 13 and 14 to row decoder 20. Input buffers 10, 12, 13 and 14 are coupled to current source 21 for receiving current therefrom. Current source 22 is coupled to input buffer 11 for providing current thereto when switched on by test row selection circuit 23. Test row selection circuit 23 is coupled between input terminal 16 and current source 22. Row deselection circuit 24 is coupled between input pin 19 and an output of input buffer 14. Input pins 15, 16, 17, 18 and 19 are used for selecting desired rows of memory. This selection of rows is accomplished by row decoder 20 according to the signals received from input buffers 10, 11, 12, 13 and 14 in a manner well known to those skilled in the art.

Input buffers 25, 26, and 27 each have an input coupled to input terminals 28, 29 and 30, respectively, for each receiving a digital input signal. Each input buffer 25, 26 and 27 has two outputs coupled to column decoder 31 for providing two complementary signals from each input buffer 25, 26 and 27 to column decoder 31. Input buffers 26 and 27 are coupled to current source 32 for receiving current therefrom. Input buffer 25 is coupled to current source 33 for receiving current therefrom when switched on by test column selection circuit 34. Test column selection circuit 34 is coupled between terminal 28 and current source 33. Column deselection circuit 35 is coupled between input terminal 30 and one of the outputs of input buffer 27. Current sources 36 and 37 are coupled between column deselection circuit 35 and column decoder 31. Input pins 28, 29 and 30 are used for selecting desired columns of memory. This selection of columns is accomplished by column decoder 31 according to the signals received from input buffers 25, 26 and 27 in a manner well known to those skilled in the art.

Word lines $38_0$–$38_{31}$ and test word lines 39, 40 and 41 are connected to row decoder 20. Bit lines $42_0$–$42_7$ and test bit line 43 are coupled between column decoder 31 and sense amplifier 44. Bit lines $45_0$–$45_7$ are coupled between column decoder 31 and sense amplifier 46. Bit lines $47_0$–$47_7$ are coupled between column decoder 31 and sense amplifier 48. Bit lines $49_0$–$49_7$ and test bit line 50 are coupled between column decoder 31 and sense amplifier 51. Sense amplifiers 44, 46, 48 and 51 are connected to output terminals 52, 53, 54 and 55, respectively, for providing an output signal on each that is representative of the voltage on a selected bit line. The embodiment illustrated in FIG. 1 illustrates a memory circuit having 32 columns and 32 rows; however, the invention described herein may be utilized with any sized memory circuit.

Each word line $38_0$–$38_{31}$, and test word line 39, 40 and 41 are uniquely coupled to each bit line $42_0$–$42_7$, $45_0$–$45_7$, $47_0$–$47_7$, $49_0$–$49_7$ and test bit lines 43 and 50 by one of a plurality of fuses 56 to form a row of fuses along each word line and a column of fuses along each bit line.

During normal operation, certain selected fuses 56 are programmed typically by the application of a high voltage to a selected word line and a selected bit line (circuitry not shown). The memory circuit is read by applying input signals to input terminals 15, 16, 17, 18, 19, 28, 29 and 30 that select the desired word line and bit line by operation of row decoder 20 and column decoder 31. One of sense amplifiers 44, 46, 48 and 51 detect the voltage on the selected bit line that represents whether the specific fuse 56 is programmed. Test row selection circuit 23, row deselection circuit 24, test column selection circuit 34 and column deselection circuit 35 are not used during normal read operation; therefore, test word lines 39, 40 and 41 and test bit lines 43 and 50 are deselected.

Figure 2:
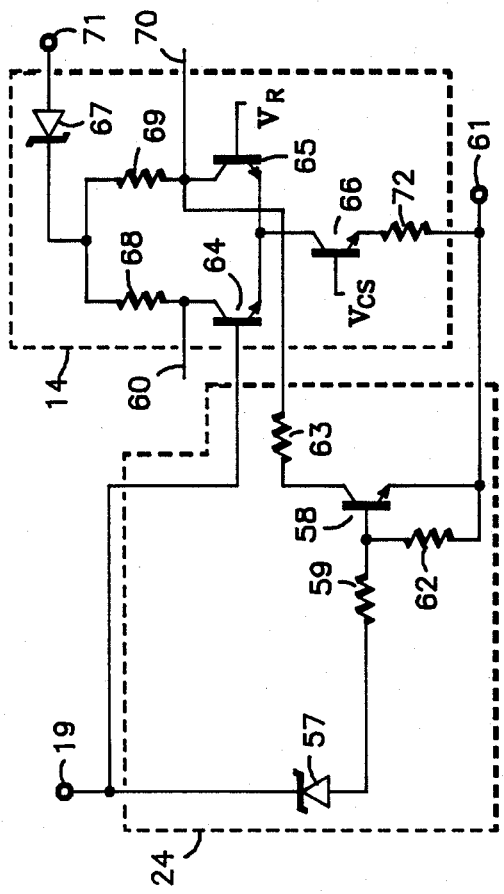
FIG. 2 is a schematic of the row deselection circuit and an input buffer of FIG. 1.

Referring to FIG. 2, row deselection circuit 24 and input buffer 14 are shown in schematic form. Row deselection circuit 24 includes zener diode 57 having a cathode connected to input terminal 19 and an anode coupled to the base of transistor 58 by resistor 59. In the normal read mode of operation, the input signal on terminal 19 is not of a high enough voltage to cause zener diode 57 to breakdown. During the testing mode, a high voltage is applied to terminal 19 that causes diode 57 to breakdown and a voltage to appear at the base of transistor 58, thereby turning on transistor 58.

The base of transistor 58 is further coupled to voltage terminal 61 by resistor 62 for setting the voltage level at the base. Terminal 61 is typically at voltage $V_{EE}$. Transistor 58 has an emitter connected to terminal 61 and a collector coupled to input buffer 14 by resistor 63. Input buffer 14 includes differentially coupled transistors 64 and 65, each having an emitter connected to the collector of current source transistor 66, and a collector coupled to a cathode of diode 67 by resistors 68 and 69, respectively. The base of transistors 64 is connected to input terminal 19 for receiving the input voltage applied thereto. The base of transistor 65 is coupled for receiving reference voltage $V_R$. The anode of diode 67 is connected to voltage terminal 71 for setting the voltage level supplied to differentially connected transistors 68 and 69. Terminal 71 is typically at voltage $V_{CC}$. Transistor 66 has a base coupled for receiving current source voltage $V_{CS}$ and an emitter coupled to voltage terminal 61 by resistor 72. The collector of transistor 58 is connected to the collector of transistor 65 by resistor 63 for pulling the voltage on the collector of transistor 65 down when the input signal on terminal 19 is a high enough voltage to overcome diode 57.

In the read mode, an input signal is applied to input terminal 19 that biases differential transistor 64 for providing complementary logic output signals on outputs 60 and 70 to row decoder 20. Diode 57 blocks the input signal on input terminal 19 from biasing transistor 58; therefore, transistor 58 will be off and no current will flow from the collector of transistor 65 (outputs 60 and 70 will be low and high, respectively). In the test mode, a high voltage input signal, i.e., 4.0 volts, is applied to input terminal 19 than biases transistor 64 on. The high voltage input signal causes diode 57 to breakdown, thereby turning transistor 58 on and pulling the collector of transistor 65 down. Therefore, both outputs 60 and 70 will be low.

Figure 3:
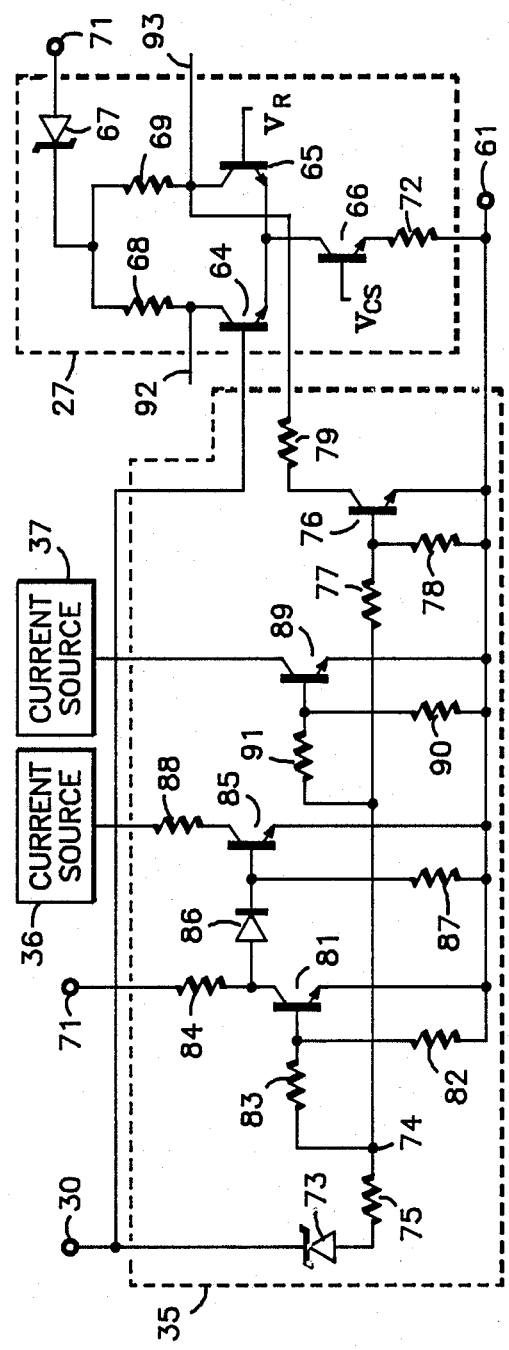
FIG. 3 is a schematic of the column deselection circuit and an input buffer of FIG. 1.

Referring to FIG. 3, column deselection circuit 35 and input buffer 27 are shown in schematic form. Input buffer 27 is identical to input buffer 14 of FIG. 1; therefore, the elements have been identified with the same numeral references. Column deselection circuit 35 includes diode 73 having a cathode connected to input terminal 30 for blocking a normal input signal applied during the read mode. Diode 73 has an anode coupled to node 74 by resistor 75. Node 74 is coupled to the base of transistor 76 by resistor 77. Transistor 76 has an emitter connected to voltage terminal 61, a base coupled to voltage terminal 61 by resistor 78, and a collector coupled to input buffer 27 by resistor 79. This portion of column deselection circuit 35 just described functions in a like manner to row deselection circuit 24. Column deselection circuit 35 further includes transistor 81 having an emitter connected to terminal 61, a base coupled to terminal 61 by resistor 82 and to node 74 by resistor 83, and a collector coupled to voltage terminal 71 by resistor 84 and to the base of transistor 85 by diode 86. Transistor 85 has its base further coupled to terminal 61 by resistor 87, an emitter connected to terminal 61, and a collector coupled to current source 36 by resistor 88. Transistor 89 has a base coupled to voltage terminal 61 by resistor 90 and to node 74 by resistor 91, an emitter connected to voltage terminal 61, and a collector connected to current source 37.

In the read mode, an input signal is applied to input terminal 30 that biases differential transistor 64 for providing complementary logic output signals on outputs 92 and 93 to column decoder 31. Diode 73 blocks the input signal on input terminal 30 from biasing transistor 76; therefore, transistor 76 will be off and no current will flow from the collector of transistor 65 (outputs 92 and 93 will be low and high, respectively). In the test mode, a high voltage input signal is applied to input terminal 30 than biases transistor 64 on. The high voltage input signal causes diode 73 to breakdown, thereby turning transistor 76 on and pulling the collector of transistor 65 down. Therefore, both outputs 92 and 93 will be low. Additionally, a high voltage input signal on input terminal 30 will turn transistor 89 on, thereby turning current source 37 off and deselecting columns $42_0$–$42_7$, $45_0$–$45_7$, $47_0$–$47_7$ and $49_0$–$49_7$. The high voltage input signal will also turn on transistor 81, turn off transistor 85, thereby turning on current source 36 and selecting test columns 43 and 50. The significance of this will be explained further in the operational summary that follows.

Figure 4:
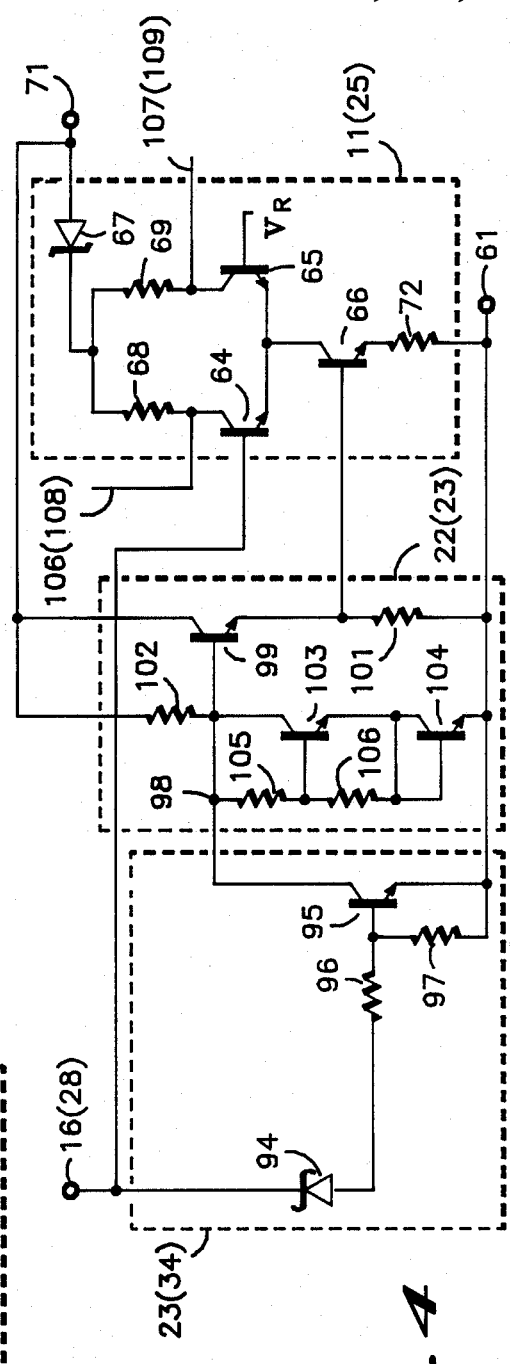
FIG. 4 is a schematic of the test row selection circuit, test column selection circuit, a current source and an input buffer of FIG. 1.

Referring to FIG. 4, test row selection circuit 23, current source 22, and input buffer 11 are shown in schematic form. Test column selection circuit 24, current source 23, and input buffer 25 are identical as reflected by the numbers in parenthesis. Input buffer 11(25) is similar to input buffer 14 of FIG. 2; therefore, the elements have been identified with the same numeral references. Test row selection circuit 23 (and test column selection circuit 34) includes diode 94 having a cathode connected to input terminal 16(28) for blocking the input signal during the read mode. Diode 94 has an anode coupled to the base of transistor 95 by resistor 96. Transistor 95 has its base further coupled to voltage terminal 61 by resistor 97, an emitter connected to terminal 61, and a collector connected to node 98. Current source 22(23) includes transistor 99 having a base connected to node 98, a collector coupled to voltage terminal 71, and an emitter connected to the base of transistor 66 and coupled to terminal 61 by resistor 101. Node 98 is coupled to voltage terminal 71 by resistor 102 for supplying a current to the base of transistor 99. Transistor 103 has an emitter connected to the base and collector of transistor 104, a collector connected to node 98, and a base coupled to node 98 and the base of transistor 104 by resistors 105 and 106, respectively. The emitter of transistor 104 is connected to terminal 61. Transistors 103 and 104 and resistors 105 and 106 form an active pull-down circuit for setting the voltage level at the base of transistor 99.

In the read mode, an input signal is applied to input terminal 16(28) that biases differential transistor 64 for providing complementary logic output signals on outputs 106(108) and 107(109) to row decoder 20 (column decoder 31). Diode 94 blocks the input signal on input terminal 16(28) from biasing transistor 95 and 99; therefore, transistor 95 will be off and transistors 99 and 66 will be on. Therefore, transistors 64 will be off and transistor 65 will be on (outputs 106(108) and 107(109) will be high and low, respectively). In the test mode, a high voltage input signal is applied to input terminal 16(28) that biases transistor 64 on. The high voltage input signal causes diode 94 to breakdown, thereby turning transistor 95 on and transistors 99 and 66 off; thereby turning off differentially connected transistors 64 and 65. Therefore, both outputs 106(108) and 107(109) will be high.

In summary, novel circuitry including test row selection circuit 23, row deselection circuit 24, test column selection circuit 34, column deselection circuit 35, test rows 39, 40, 41, and test columns 43, 50 have been added to a standard PROM without increasing the input/output pin requirements. The PROM may be used normally without accessing the novel circuitry. By applying a test voltage on input pins 16, 19, 28 and 30 that is greater in voltage than the normal input signals, the novel circuitry will deselect the normal rows and columns and select the test rows and columns. This allows for the functionality testing of on chip circuitry such as input buffers, decoders, and sense amplifiers as well as testing the fuses in the test rows and columns and providing a statistical probability of the programmability of the fuses in the standard rows and columns.

By now it should be appreciated that there has been provided an ECL PROM having circuitry including test rows and columns for testing the functionality and performance of the device without programming the memory.

What is claimed is:
1. A memory circuit comprising:
   a first plurality of input pins including a first and a second input pin;
   a second plurality of input pins including a third and a fourth input pin;
   a plurality of word lines;
   a plurality of bit lines;
   a plurality of memory elements, wherein each of said memory elements are uniquely coupled between one of said plurality of word lines and one of said plurality of bit lines;
   at least one test word line;
   at least one test bit line;
   a first plurality of test memory elements arranged in one or more rows, wherein each of said first plurality of test memory elements are uniquely coupled between one of said test word lines and one of either said bit lines or said test bit lines;
   a second plurality of test memory elements arranged in one or more columns, wherein each of said second plurality of test memory elements are uniquely coupled between one of said test bit lines and one of either said word lines or said test word lines;
   first means coupled to said plurality of word lines and said test word lines for selecting one of said word lines according to the digital states of a first plurality of input signals applied to said first plurality of input pins;
   second means coupled to said plurality of bit lines and said test bit lines for selecting one of said bit lines according to the digital states of a second plurality of input signals applied to said second plurality of input pins;
   third means coupled between said first plurality of input pins and said first means for selecting one of said word lines or said test word lines according to the digital states of the first plurality or input signals when an input signal applied to said first input pin exceeds a threshold voltage level; and
   fourth means coupled between said second plurality of input pins and said second means for selecting one of said bit lines or said test bit lines according to the digital states of the second plurality of input signals when an input signal applied to said second input pin exceeds a threshold voltage level.

2. The memory circuit according to claim 1 wherein said third means comprises:
   a first input buffer;
   a second input buffer;
   a first plurality of input buffers, each of said first plurality of input buffers, said first input buffer and said second input buffer having a first input coupled to one of said first plurality of input pins and a pair of outputs coupled to said first means;
   fifth means coupled between said first input pin and a second input of said first input buffer for causing said outputs of said first input buffer to be substantially similar when said input signal on said first input pin exceeds a threshold voltage; and
   sixth means coupled between said second input pin and one of said outputs of said second input buffer for causing said outputs of said second input buffer to be substantially similar when said input signal on said second input pin exceeds a threshold voltage.

3. The memory circuit according to claim 2 wherein said third means further comprises seventh means coupled to a second input of said first plurality of input buffers and said second input buffer for supplying current thereto.

4. The memory circuit according to claim 3 wherein said fifth means comprises:
   a first current source coupled to a second input of said first input buffer; and
   a test row selection circuit coupled between said first input pin and said first current source.

5. The memory circuit according to claim 3 wherein said fourth means comprises:
   a third input buffer;
   a fourth input buffer;
   one or more additional input buffers, each of said additional input buffers, said third input buffer and said fourth input buffer having a first input coupled to one of said second plurality of input pins and a pair of outputs coupled to said second means;
   eighth means coupled between said third input pin and a second input of said third input buffer for causing said outputs of said third input buffer to be substantially similar when said input signal on said third input pin exceeds a threshold voltage; and
   ninth means coupled between said fourth input pin and one of said outputs of said fourth input buffer for causing said outputs of said fourth input buffer to be substantially similar when said input signal on said fourth input pin exceeds a threshold voltage.

6. The memory circuit according to claim 5 wherein said fourth means further comprises tenth means coupled to a second input of said additional input buffers and said fourth input buffer for supplying current thereto.

7. The memory circuit according to claim 6 wherein said eighth means comprises:
   a second current source coupled to a second input of said third input buffer; and
   a test column selection circuit coupled between said first input pin and said second current source.

8. The memory circuit according to claim 7 wherein said ninth means comprises:
   a column deselection circuit coupled between said fourth input pin and said one of said outputs of said fourth input buffer;
   a third current source coupled between said column deselection circuit and said second means; and
   a fourth current source coupled between said column deselection circuit and said second means.

9. The memory circuit according to claim 5 wherein said ninth means comprises:
   a fifth diode having a cathode coupled to said fourth input terminal;
   twenty first means for providing a resistance;
   a tenth transistor having a base coupled to said first voltage terminal by said twenty first means and to an anode of said fifth diode, an emitter coupled to said first voltage terminal, and a collector coupled to said fourth input buffer;
   twenty second means coupled to said second means for selectively supplying current thereto;
   twenty third means coupled to said second means for selectively supplying current thereto;
   twenty fourth means coupled between said base of said tenth transistor and said twenty second means for selecting said twenty second means;
   twenty fifth means coupled between said base of said tenth transistor and said twenty third means for selecting said twenty third means.

10. The memory circuit according to claim 9 wherein said fourth input buffer comprises:
    a sixth diode having an anode coupled to said second voltage terminal;
    twenty sixth means for providing a resistance;
    twenty seventh means for providing a resistance;
    twenty eighth means for providing a resistance;
    an eleventh transistor having a base coupled to said fourth input pin, a collector coupled to a cathode of said sixth diode by said twenty sixth means, and an emitter;
    a twelfth transistor having a base coupled to receive said reference voltage, a collector coupled to said cathode of said sixth diode by said twenty seventh means, and an emitter; and
    a thirteenth transistor having a base coupled to said emitter of said tenth transistor, a collector coupled to said emitters of said eleventh and twelfth transistors, and an emitter coupled to said first voltage terminal by said twenty eighth means.

11. The memory circuit according to claim 10 wherein said eighth means comprises:
    a seventh diode having a cathode coupled to said third input pin; and
    twenty ninth means for providing a resistance;
    a fourteenth transistor having a base coupled to an anode of said seventh diode and to said first voltage terminal by said twenty ninth means, a collector coupled to said third input buffer, and an emitter coupled to said first voltage terminal.

12. The memory circuit according to claim 11 wherein said third input buffer comprises:
    an eighth diode having an anode coupled to said second voltage terminal;
    thirtieth means for providing a resistance;
    thirty first means for providing a resistance;
    thirty second means for providing a resistance;
    a fifteenth transistor having a base coupled to said third input pin, a collector coupled to a cathode of said eighth diode by said thirtieth means, and an emitter;
    a sixteenth transistor having a base coupled to receive said reference voltage, a collector coupled to said cathode of said eighth diode by said thirty first means, and an emitter; and a seventeenth transistor having a base coupled to said emitter of said fourteenth transistor, a collector coupled to said emitters of said fifteenth and sixteenth transistors, and an emitter coupled to said first voltage terminal by said thirty second means.

13. The memory circuit according to claim 2 wherein said fifth means comprises:
a first voltage terminal;
a first diode having a cathode coupled to said first input terminal;
tenth means for providing a resistance;
eleventh means for providing a resistance;
twelfth means for providing a resistance;
a first transistor having a base coupled to said first voltage terminal by said tenth means and to an anode of said first diode, an emitter coupled to said first voltage terminal, and a collector;
thirteenth means for setting a voltage level; and
a second transistor having a collector coupled to said second voltage terminal, an emitter coupled to said first voltage terminal by said eleventh means and to said first input buffer, and a base coupled to said collector of said first transistor, said first voltage terminal by said thirteenth means, and to said second voltage terminal by said twelfth means.

14. The memory circuit according to claim 13 wherein said first input buffer comprises:
a second diode having an anode coupled to said second voltage terminal;
fourteenth means for providing a resistance;
fifteenth means for providing a resistance;
sixteenth means for providing a resistance;
a third transistor having a base coupled to said first input pin, a collector coupled to a cathode of said second diode by said fourteenth means, and an emitter;
a fourth transistor having a base coupled to receive a reference voltage, a collector coupled to said cathode of said second diode by said fifteenth means, and an emitter; and
a fifth transistor having a base coupled to said emitter of said second transistor, a collector coupled to said emitters of said third and fourth transistors, and an emitter coupled to said first voltage terminal by said sixteenth means.

15. The memory circuit according to claim 14 wherein said sixth means comprises:
a third diode having a cathode coupled to said second input pin;
seventeenth means for providing a resistance; and
a sixth transistor having a base coupled to an anode of said third diode and to said first voltage terminal by said seventeenth means, a collector coupled to said second input buffer, and an emitter coupled to said first voltage terminal.

16. The memory circuit according to claim 15 wherein said second input buffer comprises:
a fourth diode having an anode coupled to said second voltage terminal;
eighteenth means for providing a resistance;
nineteenth means for providing a resistance;
twentieth means for providing a resistance;
a seventh transistor having a base coupled to said second input pin, a collector coupled to a cathode of said fourth diode by said eighteenth means, and an emitter;
an eighth transistor having a base coupled to receive said reference voltage, a collector coupled to said cathode of said fourth diode by said nineteenth means, and an emitter; and
a ninth transistor having a base coupled to said emitter of said sixth transistor, a collector coupled to said emitters of said seventh and eighth transistors, and an emitter coupled to said first voltage terminal by said twentieth means.

17. An improved programmable read only memory having a plurality of memory elements arranged in a matrix of rows and columns, each of said memory elements in a row coupled to one of a plurality of word lines, each of said memory elements in a column coupled to one of a plurality of bit lines, a row decoder coupled to said plurality of word lines, a column decoder coupled to said plurality of bit lines, a first plurality of input pins, and a second plurality of input pins, said improvement comprising:
a plurality of input buffers, each having a first input, a second input, a first output and a second output, said first input being coupled to one of said first or second plurality of input pins and said first and second outputs coupled to one of said row decoder or said column decoder, respectively wherein one of a combination of digital input signals applied to said first and second plurality of input pins selects one of said memory elements for providing an output representative of the state of said memory element;
a plurality of test memory elements arranged in one or more rows and one or more columns of said matrix; and
first means for selecting one of said plurality of test memory elements in response to a change in the voltage level of at least one of said digital input signals, said first means comprising:
second means coupled between a first input pin of said first plurality of input pins and a second input of a first input buffer of said plurality of input buffers for altering an output signals of said first input buffer when an input signals applied to said first input pin exceeds a threshold voltage level;
third means coupled between a second input pin of said first plurality of input pins and a second output of a second input buffer of said plurality of input buffers for alternating an output signal of said second input buffer when an input signal applied to said second input pin exceeds a threshold voltage level;
fourth means coupled between a third input pin of said second plurality of inputs pins and a second input of a third input buffer of said plurality of input buffers for altering an output signal of said third input buffer when an input signal applied to said third input pin exceeds a threshold voltage level; and
fifth means coupled between a second input pin of said second plurality of input pins and a second output of a fourth input buffer of said plurality of input buffers for altering an output signal of said fourth input buffer when an input signal applied to said fourth input pin exceeds a threshold voltage level.

18. The improved programmable read only memory according to claim 17 wherein said first means further comprises sixth means coupled to said second input of said plurality of input buffers except for said first and third input buffers for supplying current thereto.

19. The improved programmable read only memory according to claim 18 wherein said second means comprises:
   a first current source coupled to a second input of said first input buffer; and
   a test row selection circuit coupled between said first input pin and said first current source.

20. The improved programmable read only memory according to claim 19 wherein said fourth means comprises:
   a second current source coupled to a second input of said third input buffer; and
   a test column selection circuit coupled between said first input pin and said second current source.

21. The improved programmable read only memory according to claim 20 wherein said fifth means comprises:
   a column deselection circuit coupled between said fourth input pin and said second output of said fourth input buffer;
   a third current source coupled between said column deselection circuit and said second means; and
   a fourth current source coupled between said column deselection circuit and said second means.

22. The improved programmable read only memory according to claim 16 wherein said second means comprises:
   a first voltage terminal;
   a first diode having a cathode coupled to said first input terminal;
   seventh means for providing a resistance;
   eighth means for providing a resistance;
   ninth means for providing a resistance;
   a first transistor having a base coupled to said first voltage terminal by said seventh means and to an anode of said first diode, an emitter coupled to said first voltage terminal, and a collector;
   tenth means for setting a voltage level; and
   a second transistor having a collector coupled to said second voltage terminal, an emitter coupled to said first voltage terminal by said eighth means and to said first input buffer, and a base coupled to said collector of said first transistor, said first voltage terminal by said tenth means, and to said second voltage terminal by said ninth means.

23. The improved programmable read only memory according to claim 22 wherein said first input buffer comprises:
   a second diode having an anode coupled to said second voltage terminal;
   eleventh means for providing a resistance;
   twelfth means for providing a resistance;
   thirteenth means for providing a resistance;
   a third transistor having a base coupled to said first input pin, a collector coupled to a cathode of said second diode by said eleventh means, and an emitter;
   a fourth transistor having a base coupled to receive a reference voltage, a collector coupled to said cathode of said second diode by said twelfth means, and an emitter; and
   a fifth transistor having a base coupled to said emitter of said second transistor, a collector coupled to said emitters of said third and fourth transistors, and an emitter coupled to said first voltage terminal by said thirteenth means.

24. The improved programmable read only memory according to claim 22 wherein said third means comprises:
   a third diode having a cathode coupled to said second input pin;
   fourteenth means for providing a resistance; and
   a sixth transistor having a base coupled to an anode of said third diode and to said first voltage terminal by said fourteenth means, a collector coupled to said second input buffer, and an emitter coupled to said first voltage terminal.

25. The improved programmable read only memory according to claim 24 wherein said second input buffer comprises;
   a fourth diode having an anode coupled to said second voltage terminal;
   fifteenth means for providing a resistance;
   sixteenth means for providing a resistance;
   seventeenth means for providing a resistance;
   a seventh transistor having a base coupled to said second input pin, a collector coupled to a cathode of said fourth diode by said fifteenth means, and an emitter;
   an eighth transistor having a base coupled to receive said reference voltage, a collector coupled to said cathode of said fourth diode by said sixteenth means, and an emitter; and
   a ninth transistor having a base coupled to said emitter of said sixth transistor, a collector coupled to said emitters of said seventh and eighth transistors, and an emitter coupled to said first voltage terminal by said seventeenth means.

26. The improved programmable read only memory according to claim 25 wherein said fifth means comprises:
   a fifth diode having a cathode coupled to said fourth input terminal;
   eighteenth means for providing a resistance;
   a tenth transistor having a base coupled to said first voltage terminal by said eighteenth means and to an anode of said fifth diode, an emitter coupled to said first voltage terminal, and a collector coupled to said fourth input buffer:
   nineteenth means coupled to said second means for selectively supplying current thereto;
   twentieth means coupled to said second means for selectively supplying current thereto;
   twenty first means coupled between said base of said tenth transistor and said nineteenth means for selecting said nineteenth means;
   twenty second means coupled between said base of said tenth transistor and said twentieth means for selecting said twentieth means.

27. The memory circuit according to claim 26 wherein said fourth input buffer comprises:
   a sixth diode having an anode coupled to said second voltage terminal;
   twenty third means for providing a resistance;
   twenty sixth means for providing a resistance;
   twenty fifth means for providing a resistance;
   an eleventh transistor having a base coupled to said fourth input pin, a collector coupled to a cathode of said sixth diode by said twenty third means, and an emitter;
   a twelfth transistor having a base coupled to receive said reference voltage, a collector coupled to said cathode of said sixth diode by said twenty fourth means, and an emitter; and a thirteenth transistor having a base coupled to said emitter of said tenth transistor, a collector coupled to said emitters of said eleventh and twelfth transistors, and an emitter coupled to said first voltage terminal by said twenty fifth means.

28. The memory circuit according to claim 27 wherein said fourth means comprises:
- a seventh diode having a cathode coupled to said third input pin; and
- twenty sixth means for providing a resistance;
- a fourteenth transistor having a base coupled to an anode of said seventh diode and to said first voltage terminal by said twenty sixth means, a collector coupled to said third input buffer, and an emitter coupled to said first voltage terminal.

29. The memory circuit according to claim 28 wherein said third input buffer comprises:
- an eighth diode having an anode coupled to said second voltage terminal;
- twenty seventh means for providing a resistance;
- twenty eighth means for providing a resistance;
- twenty ninth means for providing a resistance;
- a fifteenth transistor having a base coupled to said third input pin, a collector coupled to a cathode of said eighth diode by said twenty seventh means, and an emitter;
- a sixteenth transistor having a base coupled to receive said reference voltage, a collector coupled to said cathode of said eighth diode by said twenty eighth means, and an emitter; and
- a seventeenth transistor having a base coupled to said emitter of said fourteenth transistor, a collector coupled to said emitters of said fifteenth and sixteenth transistors, and an emitter coupled to said first voltage terminal by said twenty ninth means.

* * * * *

UNITED STATES PATENT AND TRADEMARK OFFICE
CERTIFICATE OF CORRECTION

PATENT NO. : 4,731,760

DATED : March 15, 1988

INVENTOR(S) : Rajnish Maini

It is certified that error appears in the above-identified patent and that said Letters Patent is hereby corrected as shown below:

Column 10, claim 17, line 40, delete "signals" and insert therefor --signal--.

Column 10, claim 17, line 41, delete "signals" and insert therefor --signal--.

Signed and Sealed this

Sixth Day of December, 1988

Attest:

DONALD J. QUIGG

*Attesting Officer*          *Commissioner of Patents and Trademarks*